United States Patent
Cheng

(10) Patent No.: US 11,264,514 B2
(45) Date of Patent: Mar. 1, 2022

(54) THIN FILM TRANSISTOR, PIXEL STRUCTURE, DISPLAY SUBSTRATE, DISPLAY PANEL, AND DISPLAY DEVICE

(71) Applicants: Beijing BOE Technology Development Co., Ltd., Beijing (CN); BOE TECHNOLOGY GROUP CO., LTD., Beijing (CN)

(72) Inventor: Hongfei Cheng, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/966,873

(22) PCT Filed: Dec. 24, 2019

(86) PCT No.: PCT/CN2019/127815
§ 371 (c)(1),
(2) Date: Jul. 31, 2020

(87) PCT Pub. No.: WO2020/140793
PCT Pub. Date: Jul. 9, 2020

(65) Prior Publication Data
US 2021/0043776 A1    Feb. 11, 2021

(30) Foreign Application Priority Data

Jan. 20, 2019  (CN) .................. 201920001967.X

(51) Int. Cl.
*H01L 29/786* (2006.01)
*H01L 29/417* (2006.01)
*H01L 27/12* (2006.01)

(52) U.S. Cl.
CPC .. *H01L 29/78696* (2013.01); *H01L 29/41733* (2013.01); *H01L 27/1222* (2013.01)

(58) Field of Classification Search
CPC ......... H01L 29/78696; H01L 29/41733; H01L 27/1222

(Continued)

(56) References Cited

U.S. PATENT DOCUMENTS

2013/0277666 A1* 10/2013 Choi .................... H01L 27/1225
                                                              257/43
2014/0021464 A1    1/2014 Ting et al.
2019/0057979 A1* 2/2019 Xian ................. H01L 29/42384

FOREIGN PATENT DOCUMENTS

CN   101217154 A    7/2008
CN   101354505 A    1/2009

(Continued)

*Primary Examiner* — Tong-Ho Kim
(74) *Attorney, Agent, or Firm* — Houtteman Law LLC

(57) ABSTRACT

A thin film transistor is provided to include a gate, an active layer, a first electrode and a second electrode. The first electrode includes at least two first conductive parts extending in a first direction and a first connection part extending in a second direction intersecting the first direction. The at least two first conductive parts are arranged at intervals along the second direction and a first end of each of the at least first conductive parts is coupled to the first connection part, and two adjacent ones of the at least two first conductive parts form a first U-shaped opening with the first connection part. The second electrode includes at least one second conductive part extending in the first direction, a first end of the second conductive part proximal to the first connection part is in the first U-shaped opening.

16 Claims, 5 Drawing Sheets

(58) Field of Classification Search
USPC .......................................................... 257/66
See application file for complete search history.

(56) References Cited

FOREIGN PATENT DOCUMENTS

| | | |
|---|---|---|
| CN | 102208411 A | 10/2011 |
| CN | 209045572 U | 6/2019 |

* cited by examiner

THIN FILM TRANSISTOR, PIXEL STRUCTURE, DISPLAY SUBSTRATE, DISPLAY PANEL, AND DISPLAY DEVICE

CROSS-REFERENCE TO RELATED APPLICATION

The present disclosure claims priority of the Chinese patent application No. 201920001967.X filed on Jan. 2, 2019, the entire contents of which are incorporated herein by reference.

TECHNICAL FIELD

The present disclosure relates to the field of display technologies, and in particular, to a thin film transistor, a pixel structure, a display substrate, a display panel, and a display device.

BACKGROUND

A thin film transistor (TFT) is an important device in a display panel, and operating performance of the TFT directly affects display performance of the display panel. The TFT consists of a gate, an active layer, a source electrode and a drain electrode. Usually, in the TFT, the source electrode is designed to have an U shape, the drain electrode is designed to have a strip shape, and the strip-shaped drain electrode extends into an opening of the U-shaped source electrode to increase an width-to-length ratio of a conductive channel of the thin film transistor, thereby increasing an on-state current of the thin film transistor and shortening a charging time for a pixel electrode.

SUMMARY

An embodiment of the present disclosure provides a thin film transistor including a gate on a substrate, an active layer on a side of the gate distal to the substrate, and a first electrode and a second electrode on a side of the active layer distal to the gate. The first electrode includes a first connection part and at least two first conductive parts, each of the at least two first conductive parts extends in a first direction, the first connection part extends in a second direction intersecting the first direction, the at least two first conductive parts are arranged spaced apart from each other in the second direction, a first end of each of the at least two first conductive parts is electrically coupled to the first connection part, and two adjacent ones of the at least two first conductive parts form a first U-shaped opening with the first connection part; the second electrode includes at least one second conductive part, the second conductive part extends in the first direction, a first end of the second conductive part proximal to the first connection part is in the first U-shaped opening, and the first U-shaped opening includes a first region between the first end of the second conductive part and a portion of the first connection part forming the first U-shaped opening; and a first through hole is disposed in a portion of the active layer in the first region.

In some embodiments, the second electrode includes at least two second conductive parts which are arranged spaced apart from each other in the second direction; the second electrode further includes a second connection part extending in the second direction, and a second end of each of the at least two second conductive parts is electrically coupled to the second connection part; and the at least two first conductive parts and the at least two second conductive parts are alternately arranged in the second direction.

In some embodiments, the first electrode includes M first conductive parts, the second electrode includes M second conductive parts, the M first conductive parts form M−1 first U-shaped openings with the first connection part, and the first end of a respective one of the M second conductive parts is disposed in each of the M−1 first U-shaped openings; each of the M−1 first U-shaped openings includes the first region between the first end of the second conductive part in the first U-shaped opening and the portion of the first connection part forming the first U-shaped opening; the first through hole is disposed in the portion of the active layer in the first region of each of the M−1 first U-shaped openings; and M is an integer greater than 2.

In some embodiments, two adjacent ones of the at least two second conductive parts form a second U-shaped opening with the second connection part, and a second end, which is proximal to the second connection part, of the first conductive part between the two adjacent ones of the at least two second conductive parts is in the second U-shaped opening; the second U-shaped opening includes a second region between the second end of the first conductive part in the second U-shaped opening and a portion of the second connection part forming the second U-shaped opening; and a second through hole is disposed in a portion of the active layer in the second region.

In some embodiments, the first electrode includes M first conductive parts, the second electrode includes M second conductive parts, the M first conductive parts form M−1 first U-shaped openings with the first connection part, the M second conductive parts form M−1 second U-shaped openings with the second connection part, the first end of a respective one of the M second conductive parts is disposed in each of the M−1 first U-shaped openings, and the second end of a respective one of the M first conductive parts is disposed in each of the M−1 second U-shaped openings; each of the M−1 first U-shaped openings includes the first region between the first end of the second conductive part in the first U-shaped opening and the portion of the first connection part forming the first U-shaped opening; each of the M−1 second U-shaped openings includes the second region between the second end of the first conductive part in the second U-shaped opening and the portion of the second connection part forming the second U-shaped opening; the first through hole is disposed in the portion of the active layer in the first region of each of the M−1 first U-shaped openings, and the second through hole is disposed in the portion of the active layer in the second region of each of the M−1 second U-shaped openings; and M is an integer greater than 2.

In some embodiments, a width of the second through hole in the second direction is larger than a width of the first conductive part in the second direction.

In some embodiments, the second connection part is disposed on a same layer as the second conductive part.

In some embodiments, the first conductive part has a stripe shape, the second conductive part has a stripe shape, and the first conductive part is parallel to the second conductive part.

In some embodiments, the first connection part is disposed on a same layer as the first conductive part.

In some embodiments, a width of the first through hole in the second direction is larger than a width of the second conductive part in the second direction.

In some embodiments, the first through hole has one of an elliptical shape, a circular shape, and a rectangular shape.

In an embodiment of the present disclosure, a pixel structure is provided to include the thin film transistor described above.

In an embodiment of the present disclosure, a display substrate is provided to include a plurality of pixel structures, and the plurality of pixel structures each include the pixel structure described above.

In an embodiment of the present disclosure, a display panel is provided to include the display substrate described above.

In an embodiment of the present disclosure, a display device is provided to include the display panel described above.

DETAILED DESCRIPTION

In order to enable those skilled in the art to better understand technical solutions of the present disclosure, a thin film transistor, a pixel structure, a display substrate, a display panel, and a display device provided in the present disclosure are described in detail below with reference to the accompanying drawings.

Hereinafter, one of "first electrode" and "second electrode" is a source electrode of a thin film transistor, and the other thereof is a drain electrode of the thin film transistor.

when a thin film transistor is turned on, in a U-shaped opening of a source electrode, since an end portion of a drain electrode in the U-shaped opening corresponds to a large region of the source electrode (entire bottom of the U-shaped opening), current flowing through the end portion of the drain electrode in the U-shaped opening is large, so that a region of an active layer corresponding to the end portion gives off a lot of heat, and the operation of the thin film transistor is affected.

Figure 1:
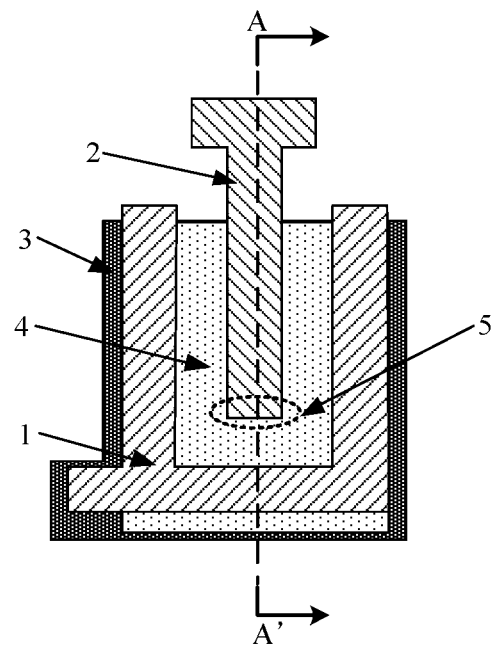
FIG. 1 is a top view of a conventional thin film transistor.
Figure 2:
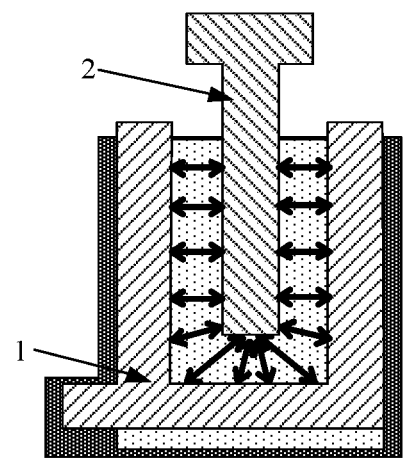
FIG. 2 is a schematic view illustrating a movement direction of carriers in each of regions of a conductive channel when the thin film transistor shown in FIG. 1 is in an on state.

FIG. 1 is a top view of a conventional thin film transistor; FIG. 2 is a schematic view illustrating a movement direction of carriers in each of regions of a conductive channel when the thin film transistor shown in FIG. 1 is in an on state; and FIG. 3 is a cross-sectional view of the thin film transistor of FIG. 1, which is taken along line A-A'.

Figure 3:
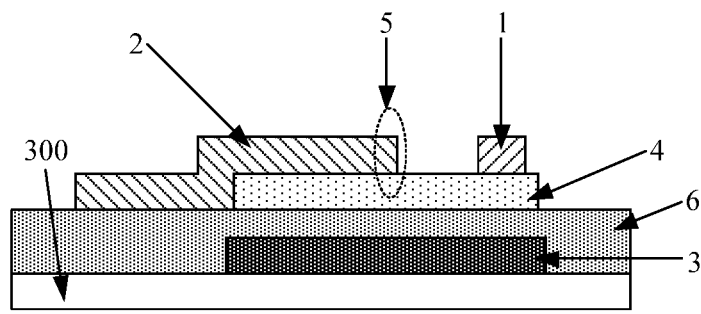
FIG. 3 is a cross-sectional view of the thin film transistor of FIG. 1, which is taken along a line A-A'.

As shown in FIGS. 1-3, the thin film transistor includes: a gate 3 on a substrate 300, an active layer 4 on a side of the gate 3 distal to the substrate, and a first electrode 1 and a second electrode 2 on a side of the active layer 4 distal to the gate 3. A gate insulating layer 6 is provided between the gate 3 and the active layer 4. The first electrode 1 is a U-shaped electrode, the second electrode 2 is a strip-shaped electrode, and an end 5 of the second electrode 2 extends into a U-shaped opening of the first electrode 1. In the U-shaped opening, the end 5 of the second electrode 2 facing the bottom of the U-shaped opening corresponds to the entire bottom of the U-shaped first electrode 1, therefore, when the thin film transistor is in an on state, current flowing through the end 5 of the second electrode 2 corresponding to the bottom of the U-shaped opening is large, and a portion of the active layer 4 proximal to the end 5 gives off a lot of heat, and the operation of the thin film transistor is affected.

It will be understood that the substrate 300 and the gate insulating layer 6 are omitted in FIGS. 1 and 2 for clarity.

In order to solve the above technical problems, the present disclosure provides a thin film transistor, and the technical solutions of the present disclosure will be described in detail below with reference to the accompanying drawings.

Figure 4:
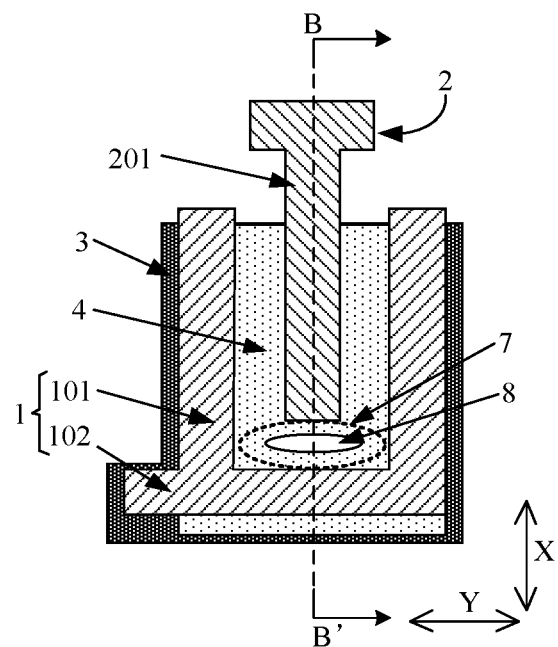
FIG. 4 is a top view of a thin film transistor according to an embodiment of the present disclosure.
Figure 5:
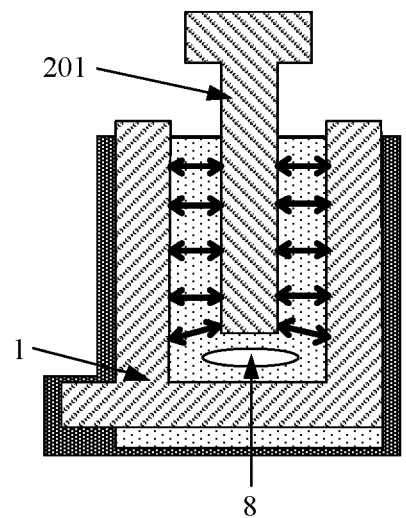
FIG. 5 is a schematic view illustrating a movement direction of carriers in each of regions of a conductive channel when the thin film transistor shown in FIG. 4 is in an on state.
Figure 6:
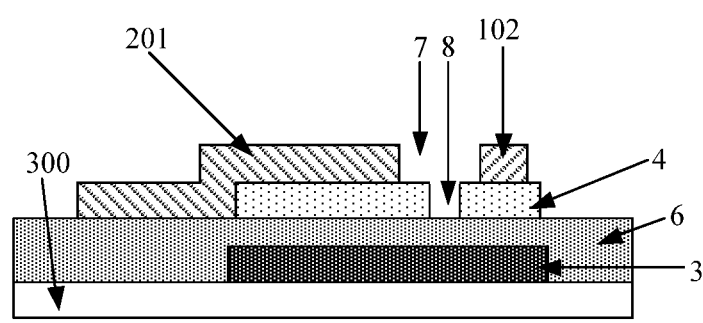
FIG. 6 is a cross-sectional view of the thin film transistor of FIG. 4, which is taken along line B-B'.

FIG. 4 is a top view of a thin film transistor according to an embodiment of the present disclosure; FIG. 5 is a schematic view illustrating a movement direction of carriers in each of regions of a conductive channel when the thin film transistor shown in FIG. 4 is in an on state; FIG. 6 is a cross-sectional view of the thin film transistor of FIG. 4, which is taken along line B-B'.

As shown in FIGS. 4-6, the thin film transistor includes: a gate 3 on a substrate 300, an active layer 4 on a side of the gate 3 distal to the substrate, and a first electrode 1 and a second electrode 2 on a side of the active layer 4 distal to the gate 3.

As shown in FIGS. 4-6, the first electrode 1 includes at least two first conductive parts 101 extending in a first direction X and a first connection part 102 extending in a second direction Y intersecting the first direction X, the first conductive parts 101 are arranged in the second direction Y, a first end of each first conductive part 101 is electrically coupled to the first connection part 102, and a first U-shaped opening is formed between the two adjacent first conductive parts 101 and a portion of the first connection part 102 between the two adjacent first conductive parts 101.

As shown in FIGS. 4-6, the second electrode 2 includes at least one second conductive part 201 extending in the first direction X, a first end of the second conductive part 201 proximal to the first connection part 102 is in the first U-shaped opening, for example, the second conductive part 201 is located between the two adjacent first conductive parts 101, and the first end of the second conductive part 201 is close to the first connection part 102. A first region 7 is an region between the first end of the second conductive part 201 and a bottom of the first U-shaped opening (i.e., a portion of the first connection part 102 constituting the first U-shaped opening). That is, the first U-shaped opening includes the first region 7 between the first end of the second conductive part 201 and the portion of the first connection part 102 forming the first U-shaped opening.

A first through hole 8 is disposed in a portion of the active layer 4 overlapping the first region 7, when viewed from the top view (i.e., from a third direction perpendicular to the first direction X and the second direction Y).

It is noted that the U-shaped electrode in the present application (for example, the first electrode 1 in FIG. 4) does not necessarily have an arc-shaped bottom. As shown in FIG. 4, the bottom and sidewalls of the U-shaped electrode of the present application are both strip-shaped, and an angle is formed between the bottom and the sidewall, for example, the angle may be substantially a right angle. Therefore, in the thin film transistor of the present application, the U-shaped first electrode merely means that portions thereof form a semi-enclosed structure having an opening through which the second electrode may extend into the semi-enclosed structure.

Specifically, as shown in FIG. 4, the first electrode 1 includes the first connection part 102 and two first conductive parts 101, each of the first conductive parts 101 includes the first end and a second end and extends in the first direction X, and the first connection part 102 extends in the second direction Y intersecting the first direction X. The two first conductive parts 101 are arranged in the second direction Y and spaced apart from each other. The first end of each of the first conductive parts 101 is electrically coupled to the first connection part 102, and the second ends of the two first conductive parts 101 are disposed on a same side of the first connection part 102, so that the two first conductive parts 101 and the first connection part 102 form a semi-enclosed structure having an opening. The second electrode 2 includes the second conductive part 201 extending in the first direction X and extending between the second ends of two first conductive parts 101 (i.e. passing through the entrance of the semi-enclosed structure) towards the first connection part 102. The first region 7 is defined between the first end of the second conductive part 201 proximal to the first connection part 102 and the first connection part 102. The first through hole 8 is disposed in the portion of the active layer 4 in the first region 7.

It is noted that a gate insulating layer 6 is provided between the gate 3 and the active layer 4, and the substrate 300 and the gate insulating layer 6 are omitted in FIGS. 4 and 5 for clarity.

It is noted that FIG. 4 shows a case that the first electrode 1 includes two first conductive parts 101 and the second electrode 2 includes one second conductive part 201, but the present disclosure is not limited thereto. For example, the first electrode 1 may include more than two first conductive parts, and/or the second electrode 2 may include more than one second conductive part.

As shown in FIG. 5, when the thin film transistor is in an on state, a portion of the first electrode 1 located at the bottom of the first U-shaped opening may not form a conductive channel with the first end of the second conductive part 201 due to the first through hole 8. For example, in some embodiments, the portion of the first connection part 102 forming the first U-shaped opening may not form a conductive channel with the first end of the second conductive part 201. For example, in some embodiments, a portion of the first conductive part 101 proximal to the first connection part 102 may not form a conductive channel with the first end of the second conductive part 201. Therefore, as shown in FIG. 5, a width of the conductive channel formed by the first end of the second conductive part 201 is reduced, and current flowing through the first end of the second conductive part 201 is decreased, so that it is possible to avoid a problem that a temperature of a portion of the active layer 4 in the vicinity of the first end of the second conductive part 201 is increased due to an excessive current flowing through the first end of the second conductive part 201, and to ensure the normal operation of the thin film transistor.

In this case, the disposition of the first through hole 8 does not substantially affect a total width-to-length ratio of the conductive channel of the thin film transistor, so that the on-state current of the thin film transistor does not change obviously.

As shown in FIGS. 4 and 5, the first through hole 8 has an elliptical shape when viewed from the top view, but the present disclosure is not limited thereto. For example, the first through hole 8 may have a circular shape, a rectangular shape, or other regular or irregular shapes. In addition, as shown in FIGS. 4-6, in the embodiments of the present disclosure, one first through hole 8 is disposed in the first region 7, but the present disclosure is not limited thereto. For example, two or more through holes may be provided in the first region 7.

In some embodiments, the first conductive part 101 has a stripe shape, the second conductive part 201 has a stripe shape, and the first conductive part 101 and the second conductive part 201 are arranged in parallel, but the disclosure is not limited thereto. For example, the first conductive part 101 and the second conductive part 201 may not have the stripe shape. For example, the first conductive part 101 and the second conductive part 201 may not be arranged in parallel.

In some embodiments, the first connection part 102 and the first conductive part 101 are arranged on a same layer, that is, the first connection part 102 and the first conductive part 101 may be integrally formed through a patterning process, thereby simplifying process steps for forming the first electrode 1.

It should be noted that the patterning process in the present disclosure may include depositing a material film, coating photoresist, exposing, developing, etching the material film, stripping the photoresist, and the like.

In some embodiments, a width of the first through hole 8 in the second direction Y is greater than a width of the second conductive part 201 in the second direction Y, which facilitates to reduce the current flowing through the first end of the second conductive part 201.

Figure 7:
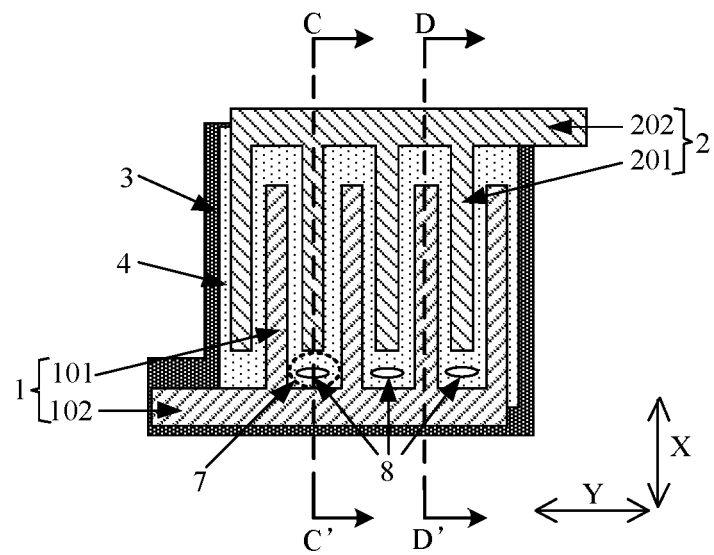
FIG. 7 is a top view of another thin film transistor according to an embodiment of the present disclosure.
Figure 8A:
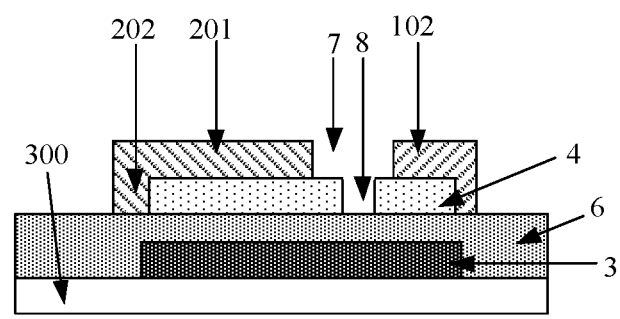
FIG. 8a is a cross-sectional view of the thin film transistor of FIG. 7, which is taken along a line C-C'.
Figure 8B:
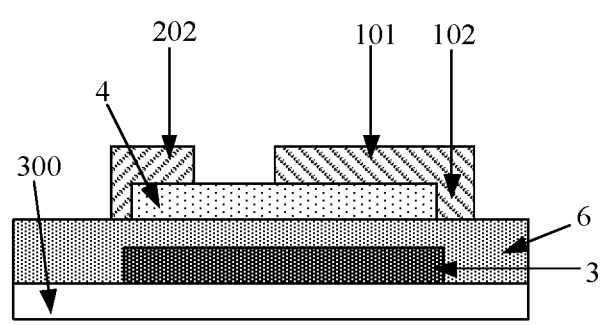
FIG. 8b is a cross-sectional view of the thin film transistor of FIG. 7, which is taken along a line D-D'.

FIG. 7 is a top view of another thin film transistor according to an embodiment of the present disclosure; FIG. 8a is a cross-sectional view of the thin film transistor of FIG. 7, which is taken along line C-C'; FIG. 8b is a cross-sectional view of the thin film transistor of FIG. 7, which is taken along line D-D'. A structure of a thin film transistor shown in an embodiment of FIGS. 7-8b is similar to that of the thin film transistor shown in the embodiment of FIGS. 4-6. Therefore, the description that has been given with reference to FIGS. 1-6 will be briefly described or omitted.

As shown in FIGS. 7-8b, in some embodiments, the second electrode 2 includes at least two second conductive parts 201 extending in the first direction X and arranged in the second direction Y, the second electrode 2 further includes a second connection part 202 extending in the second direction Y, and second ends of the second conductive parts 201 are electrically coupled to the second connection part 202. As shown in FIGS. 7-8b, the first conductive parts 101 and the second conductive parts 201 extend in the first direction X and are alternately arranged in the second direction Y.

FIG. 7 shows that the second electrode 2 includes four second conductive parts 201 and the first electrode 1 includes four first conductive parts 101, but the present disclosure is not limited thereto. In the thin film transistor according to the embodiments of the present disclosure, the second electrode 2 may include more or less than four second conductive parts 201, and/or the first electrode 1 may include four or less than four first conductive parts 101.

As shown in FIG. 7, the four first conductive parts 101 may form three first U-shaped openings with the first connection part 102, and each of the first U-shaped openings is provided with one second conductive part 201 therein; the four second conductive parts 201 may form three second U-shaped openings with the second connection part 202, and each of the second U-shaped openings is provided with one first conductive part 101 therein; each of the first U-shaped openings includes the first region 7 between the first end of the second conductive part 201 in the first U-shaped opening and the bottom of the first U-shaped opening (i.e., the portion of the first connection part 102 forming the first U-shaped opening).

By providing a plurality of first conductive parts 101 and a plurality of second conductive parts 201, the width-to-length ratio of the conductive channel of the thin film transistor can be further increased, and thus the on-state current of the thin film transistor can be further increased, and the charging time for the pixel electrode can be shortened.

In this case, the first through hole 8 is provided in the first region 7 of each of the first U-shaped openings, so that the current flowing through the first end of the second conductive part 201 in each of the first U-shaped openings can be reduced, and it is possible to avoid the problem that the temperature of the portion of the active layer 4 in the vicinity of the first end of the second conductive part 201 is increased due to an excessive current flowing through the first end of the second conductive part 201, and to ensure the normal operation of the thin film transistor.

Therefore, the thin film transistor according to the embodiment of the present disclosure can also avoid increase of the temperature of the active layer 4 while increasing the on-state current of the thin film transistor.

In some embodiments, the second connection part 202 and the second conductive part 201 are disposed on a same layer, that is, the second connection part 202 and the second conductive part 201 may be integrally formed through a patterning process, thereby simplifying process steps for forming the second electrode 2.

Figure 9:
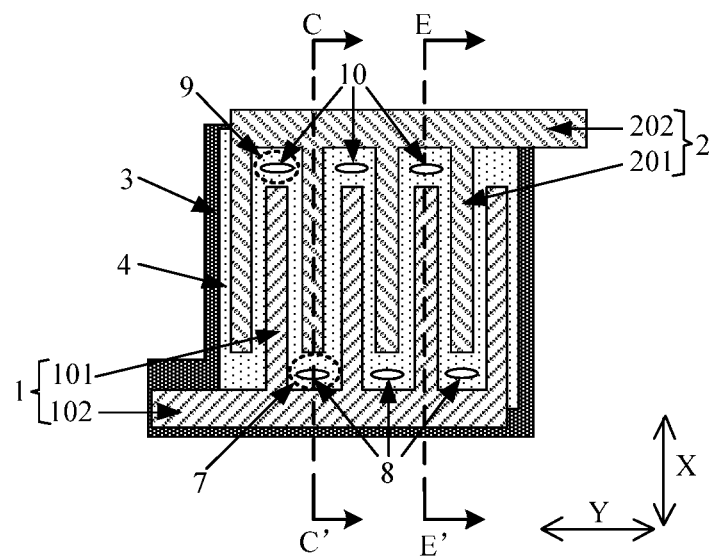
FIG. 9 is a top view of another thin film transistor according to an embodiment of the present disclosure.
Figure 10:
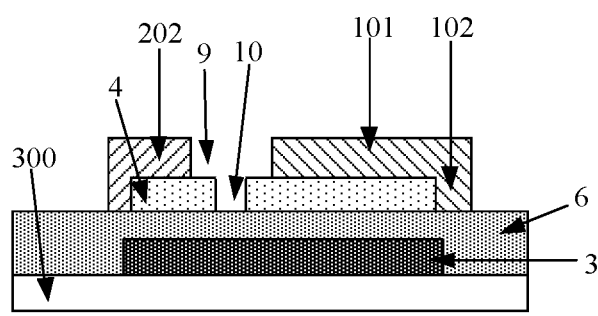
FIG. 10 is a cross-sectional view of the thin film transistor of FIG. 9, which is taken along a line E-E'.

FIG. 9 is a top view of another thin film transistor according to an embodiment of the present disclosure; FIG. 10 is a cross-sectional view of the thin film transistor of FIG. 9, which is taken along line E-E'. A structure of a thin film transistor shown in an embodiment of FIGS. 9 and 10 is similar to that of the thin film transistor shown in the embodiment of FIGS. 7-8b. Therefore, the description that has been given with reference to FIGS. 1-8b will be briefly described or omitted.

As shown in FIGS. 9 and 10, the second end, which is proximal to the second connection part 202, of the first conductive part 101 located between two adjacent second conductive parts 201 is in the second U-shaped opening formed by the two adjacent second conductive parts 201 and the second connection part 202. In the second U-shaped opening, a second region 9 is located between the second end of the first conductive part 101 in the second U-shaped opening and the bottom of the second U-shaped opening.

As shown in FIGS. 9 and 10, the four first conductive parts 101 included in the first electrode 1 may form three first U-shaped openings with the first connection part 102, and each of the first U-shaped openings is provided with one second conductive part 201 therein. The four second conductive parts 201 included in the second electrode 2 may form three second U-shaped openings with the second connection part 202, and each of the second U-shaped openings is provided with one first conductive part 101 therein. Each of the first U-shaped openings includes the first region 7 between the first end of the second conductive part 201 in the first U-shaped opening and the bottom of the first U-shaped opening (i.e., the portion of the first connection part 102 forming the first U-shaped opening). Each of the second U-shaped openings includes the second region 9 between the second end of the first conductive part 101 in the second U-shaped opening and the bottom of the second U-shaped opening (i.e., a portion of the second connection part 202 forming the second U-shaped opening).

As shown in FIGS. 9 and 10, in the thin film transistor according to the embodiment of the present disclosure, the first through hole 8 is provided in the first region 7 of each of the first U-shaped openings, and a second through hole 10 is provided in the second region 9 of each of the second U-shaped openings. That is, when viewed from a top view (i.e., when viewed from a direction perpendicular to the first direction X and the second direction Y), the second through hole 10 is provided in a portion of the active layer 4 that overlaps the second region 9.

As shown in FIGS. 9 and 10, the second through hole 10 has an elliptical shape when viewed from the top view, but the present disclosure is not limited thereto. For example, the second through hole 10 may have a circular shape, a rectangular shape, or other regular or irregular shapes. In addition, as shown in FIGS. 9 and 10, in the embodiment of the present disclosure, one second through hole 10 is provided in each second region 9, but the present disclosure is not limited thereto. For example, two or more second through holes 10 may be provided in each second region 9.

FIG. 9 shows that the second electrode 2 includes four second conductive parts 201 and the first electrode 1 includes four first conductive parts 101, but the present disclosure is not limited thereto. In the thin film transistor according to the embodiment of the present disclosure, the second electrode 2 may include more or less than four second conductive parts 201, and/or the first electrode 1 may include four or less than four first conductive parts 101.

The cross-sectional view of FIG. 9 taken along line C-C' can be seen in FIG. 8a, which is not repeated here.

In the thin film transistor according to the embodiment of the present disclosure, the second through hole 10 is provided in the second region 9 of each of the second U-shaped openings, so that current flowing through the second end of the first conductive part 101 in each of the second U-shaped openings can be reduced, and it is possible to avoid a problem that a portion of the active layer 4 in the vicinity of the second end of the first conductive part 101 gives off a lot of heat, and to ensure the normal operation of the thin film transistor.

In some embodiments, a width of the second through hole 10 in the second direction Y is greater than a width of the first conductive part 101 in the second direction Y, which facilitates to reduce the current flowing through the second end of the first conductive part 101 in the second U-shaped opening.

An embodiment of the present disclosure is provided a pixel structure including the thin film transistor in the above embodiments.

An embodiment of the present disclosure is provided a display substrate including a plurality of pixel structures including the pixel structure in the above embodiment.

An embodiment of the present disclosure is provided a display panel including the display substrate in the above embodiment.

An embodiment of the present disclosure is provided a display device including the display panel in the above embodiment.

In some embodiments, the display device includes a liquid crystal panel, an electronic paper, a mobile phone, a tablet computer, a television, a display, a laptop, a digital photo frame, a navigator, or any other products or components with display function.

It will be understood that the above embodiments are merely exemplary embodiments to illustrate the principles of the present disclosure, and the present disclosure is not limited thereto. It will be apparent to those skilled in the art that various changes and modifications can be made therein without departing from the spirit and scope of the disclosure, and the changes and modifications are also within the scope of the disclosure.

What is claimed is:

1. A thin film transistor, comprising:
    a gate on a substrate;
    an active layer on a side of the gate distal to the substrate; and
    a first electrode and a second electrode on a side of the active layer distal to the gate,
    wherein the first electrode comprises a first connection part and at least two first conductive parts, each of the at least two first conductive parts extends in a first direction, the first connection part extends in a second direction intersecting the first direction, the at least two first conductive parts are arranged spaced apart from each other in the second direction, a first end of each of the at least two first conductive parts is electrically coupled to the first connection part, and two adjacent ones of the at least two first conductive parts form a first U-shaped opening with the first connection part;
    the second electrode comprises at least one second conductive part, the second conductive part extends in the first direction, a first end of the second conductive part proximal to the first connection part is in the first U-shaped opening, and the first U-shaped opening comprises a first region between the first end of the second conductive part and a portion of the first connection part forming the first U-shaped opening; and
    a first through hole is disposed in a portion of the active layer in the first region;
    the second electrode comprises at least two second conductive parts which are arranged spaced apart from each other in the second direction;
    the second electrode further comprises a second connection part extending in the second direction, and a second end of each of the at least two second conductive parts is electrically coupled to the second connection part; and
    the at least two first conductive parts and the at least two second conductive parts are alternately arranged in the second direction;
    the first electrode comprises M first conductive parts, the second electrode comprises M second conductive parts, the M first conductive parts form M−1 first U-shaped openings with the first connection part, and the first end of a respective one of the M second conductive parts is disposed in each of the M−1 first U-shaped openings;
    each of the M−1 first U-shaped openings comprises the first region between the first end of the second conductive part in the first U-shaped opening and the portion of the first connection part forming the first U-shaped opening;
    the first through hole is disposed in the portion of the active layer in the first region of each of the M−1 first U-shaped openings; and
    M is an integer greater than 2.

2. The thin film transistor of claim 1, wherein the second connection part is disposed on a same layer as the second conductive part.

3. The thin film transistor of claim 1, wherein the first conductive part has a stripe shape, the second conductive part has a stripe shape, and the first conductive part is parallel to the second conductive part.

4. The thin film transistor of claim 1, wherein the first connection part is disposed on a same layer as the first conductive part.

5. A pixel structure, comprising the thin film transistor of claim 1.

6. A display substrate, comprising a plurality of pixel structures, wherein the plurality of pixel structures comprises the pixel structure of claim 5.

7. A display panel, comprising the display substrate of claim 6.

8. A display device, comprising the display panel of claim 7.

9. The thin film transistor of claim 1, wherein a width of the first through hole in the second direction is larger than a width of the second conductive part in the second direction.

10. A thin film transistor, comprising:
    a gate on a substrate;
    an active layer on a side of the gate distal to the substrate; and
    a first electrode and a second electrode on a side of the active layer distal to the gate,
    wherein the first electrode comprises a first connection part and at least two first conductive parts, each of the at least two first conductive parts extends in a first direction, the first connection part extends in a second direction intersecting the first direction, the at least two first conductive parts are arranged spaced apart from each other in the second direction, a first end of each of the at least two first conductive parts is electrically coupled to the first connection part, and two adjacent ones of the at least two first conductive parts form a first U-shaped opening with the first connection part;
    the second electrode comprises at least one second conductive part, the second conductive part extends in the first direction, a first end of the second conductive part proximal to the first connection part is in the first U-shaped opening, and the first U-shaped opening comprises a first region between the first end of the second conductive part and a portion of the first connection part forming the first U-shaped opening; and
    a first through hole is disposed in a portion of the active layer in the first region;
    the second electrode comprises at least two second conductive parts which are arranged spaced apart from each other in the second direction;
    the second electrode further comprises a second connection part extending in the second direction, and a second end of each of the at least two second conductive parts is electrically coupled to the second connection part; and
    the at least two first conductive parts and the at least two second conductive parts are alternately arranged in the second direction;

two adjacent ones of the at least two second conductive parts form a second U-shaped opening with the second connection part, and a second end, which is proximal to the second connection part, of the first conductive part between the two adjacent ones of the at least two second conductive parts is in the second U-shaped opening;

the second U-shaped opening comprises a second region between the second end of the first conductive part in the second U-shaped opening and a portion of the second connection part forming the second U-shaped opening; and a second through hole is disposed in a portion of the active layer in the second region.

11. The thin film transistor of claim 10, wherein the first electrode comprises M first conductive parts, the second electrode comprises M second conductive parts, the M first conductive parts form M−1 first U-shaped openings with the first connection part, the M second conductive parts form M−1 second U-shaped openings with the second connection part, the first end of a respective one of the M second conductive parts is disposed in each of the M−1 first U-shaped openings, and the second end of a respective one of the M first conductive parts is disposed in each of the M−1 second U-shaped openings;

each of the M−1 first U-shaped openings comprises the first region between the first end of the second conductive part in the first U-shaped opening and the portion of the first connection part forming the first U-shaped opening;

each of the M−1 second U-shaped openings comprises the second region between the second end of the first conductive part in the second U-shaped opening and the portion of the second connection part forming the second U-shaped opening;

the first through hole is disposed in the portion of the active layer in the first region of each of the M−1 first U-shaped openings, and the second through hole is disposed in the portion of the active layer in the second region of each of the M−1 second U-shaped openings; and M is an integer greater than 2.

12. The thin film transistor of claim 10, wherein a width of the second through hole in the second direction is larger than a width of the first conductive part in the second direction.

13. The thin film transistor of claim 10, wherein a width of the first through hole in the second direction is larger than a width of the second conductive part in the second direction.

14. A pixel structure, comprising the thin film transistor of claim 10.

15. A thin film transistor, comprising:

a gate on a substrate;

an active layer on a side of the gate distal to the substrate; and a first electrode and a second electrode on a side of the active layer distal to the gate, wherein the first electrode comprises a first connection part and at least two first conductive parts, each of the at least two first conductive parts extends in a first direction, the first connection part extends in a second direction intersecting the first direction, the at least two first conductive parts are arranged spaced apart from each other in the second direction, a first end of each of the at least two first conductive parts is electrically coupled to the first connection part, and two adjacent ones of the at least two first conductive parts form a first U-shaped opening with the first connection part;

the second electrode comprises at least one second conductive part, the second conductive part extends in the first direction, a first end of the second conductive part proximal to the first connection part is in the first U-shaped opening, and the first U-shaped opening comprises a first region between the first end of the second conductive part and a portion of the first connection part forming the first U-shaped opening; and a first through hole is disposed in a portion of the active layer in the first region, wherein a width of the first through hole in the second direction is larger than a width of the second conductive part in the second direction; and/or the first through hole has one of an elliptical shape, a circular shape, and a rectangular shape.

16. A pixel structure, comprising the thin film transistor of claim 15.

* * * * *